United States Patent
Shiga et al.

(10) Patent No.: US 7,518,901 B2
(45) Date of Patent: Apr. 14, 2009

(54) FERROELECTRIC SEMICONDUCTOR MEMORY DEVICE AND METHOD FOR READING THE SAME

(75) Inventors: Hidehiro Shiga, Kamakura (JP); Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 7 days.

(21) Appl. No.: 11/877,890

(22) Filed: Oct. 24, 2007

(65) Prior Publication Data

US 2008/0101107 A1   May 1, 2008

(30) Foreign Application Priority Data

Oct. 25, 2006   (JP)   ............... 2006-289973

(51) Int. Cl.
*G11C 11/22*   (2006.01)
*G11C 11/24*   (2006.01)
(52) U.S. Cl. .................... 365/145; 365/149
(58) Field of Classification Search ............. 365/145, 365/149
See application file for complete search history.

(56) References Cited

U.S. PATENT DOCUMENTS

| | | | |
|---|---|---|---|
| 5,903,492 A | 5/1999 | Takashima | |
| 6,151,242 A * | 11/2000 | Takashima | 365/145 |
| 6,697,279 B2 * | 2/2004 | Schneider et al. | 365/145 |
| 6,934,177 B2 * | 8/2005 | Takashima | 365/145 |
| 6,990,007 B2 * | 1/2006 | Shiratake | 365/145 |
| 7,046,541 B2 * | 5/2006 | Ogiwara et al. | 365/145 |
| 7,064,972 B2 * | 6/2006 | Takashima | 365/145 |
| 7,099,178 B2 * | 8/2006 | Shiratake | 365/145 |
| 7,154,766 B2 * | 12/2006 | Oikawa et al. | 365/145 |

OTHER PUBLICATIONS

N. Tanabe, et al., "High Tolerance Operation of 1T/2C FeRAMs for the Variation of Cell Capacitors Characteristics", 1998 Symposium on VLSI Technology Digest of Technical Papers, 1998, pp. 124-125.

* cited by examiner

*Primary Examiner*—Trong Phan
(74) *Attorney, Agent, or Firm*—Oblon, Spivak, McClelland, Maier & Neustadt, P.C.

(57) ABSTRACT

A first ferroelectric memory cell and a second ferroelectric memory cell each include a ferroelectric capacitor and a transistor and each store one set of information. A word-line is shared by the first and second ferroelectric memory cells. A first plate line is connected to the first ferroelectric memory cell and a second plate line is connected to the second ferroelectric memory cell. A selection transistor has one end connected to the first and second ferroelectric memory cells and the other end connected to a bit-line.

11 Claims, 7 Drawing Sheets

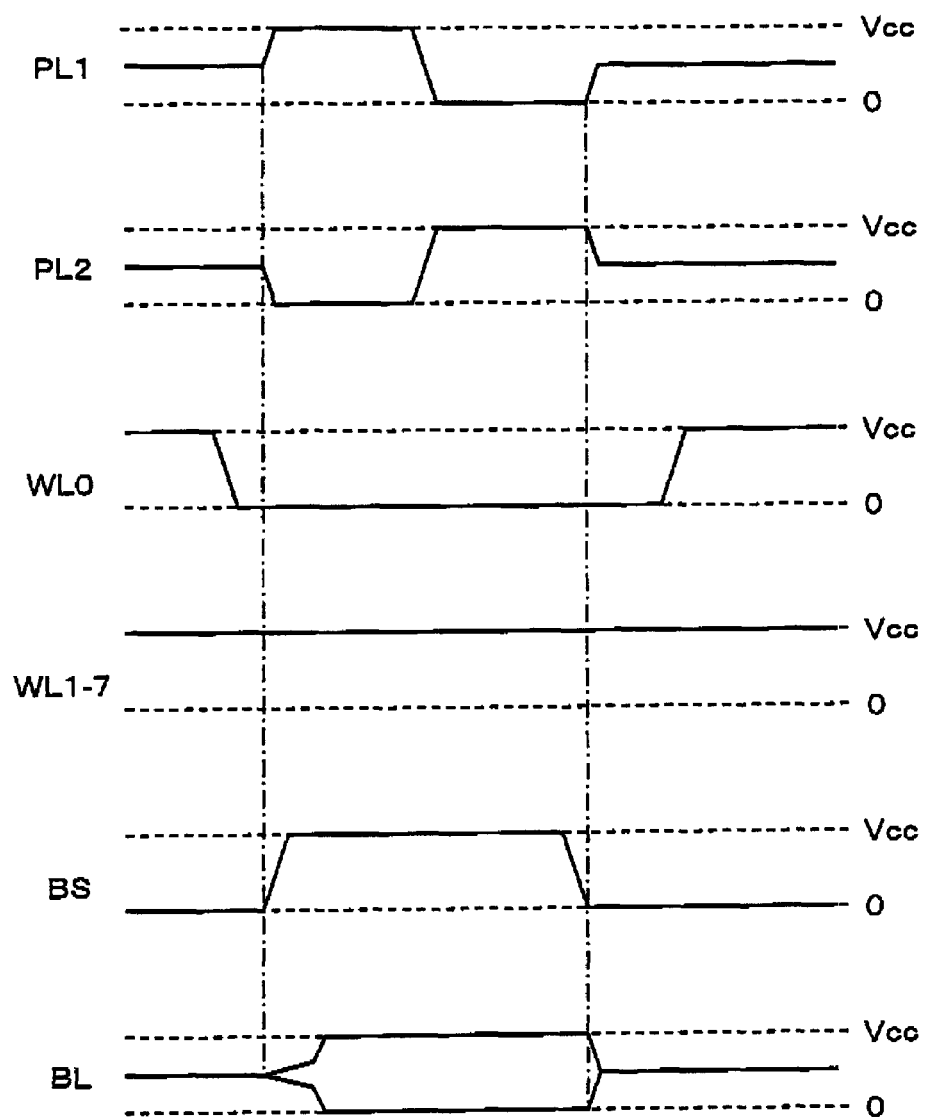

FERROELECTRIC SEMICONDUCTOR MEMORY DEVICE AND METHOD FOR READING THE SAME

CROSS REFERENCE TO RELATED APPLICATIONS

This application is based on and claims the benefit of priority from prior Japanese Patent Application No. 2006-289973, filed on Oct. 25, 2006, the entire contents of which are incorporated herein by reference.

BACKGROUND OF THE INVENTION

1. Field of the Invention

The present invention relates to ferroelectric semiconductor memory devices and a method for reading the same, and more particularly, to a ferroelectric semiconductor memory device including a plurality of ferroelectric memory cells, each memory cell including a ferroelectric capacitor and a transistor connected thereto, and a method for reading information written in the ferroelectric semiconductor memory device.

2. Description of the Related Art

Semiconductor memory devices include ferroelectric memories (FeRAM) such as a TC parallel unit series-connected ferroelectric memory. The TC parallel unit series-connected FeRAM includes a plurality of ferroelectric memory cells, each memory cell including a ferroelectric capacitor and a transistor connected thereto.

Proposed configurations for the conventional ferroelectric memories such as the TC parallel unit series-connected FeRAM include a 1T1C scheme described in JPH 09-120700 and a 2T2C scheme. These schemes allow for high integration of the ferroelectric memory cells by allowing them to share a plate line.

Other proposed schemes than the 1T1C scheme and 2T2C scheme include a 1T2C scheme as described in "1998 symposium on VLSI technology digest of technical papers," pp. 124-125. This scheme uses a reference voltage of Vcc/2 [V] when reading, thereby facilitating the circuit design of the sense circuit and allowing for stable reading.

SUMMARY OF THE INVENTION

A ferroelectric semiconductor memory device according to an aspect of the present invention comprises: a first ferroelectric memory cell and a second ferroelectric memory cell, the memory cells together storing one set of information, each memory cell comprising a ferroelectric capacitor for holding a charge and a transistor connected in parallel to the ferroelectric capacitor; a word-line shared by the first and second ferroelectric memory cells; a first plate line connected to the first ferroelectric memory cell; a second plate line connected to the second ferroelectric memory cell; a selection transistor having one end connected to both the first and second ferroelectric memory cells and another end connected to a bit-line; and a control circuit controlling voltages applied to a gate of the selection transistor, the first plate line, the second plate line, the word-line, and the bit-line.

A method for reading a ferroelectric semiconductor memory device according to an aspect of the present invention comprises: a first cell block and a second cell block, each cell block comprising a plurality of ferroelectric memory cells connected in series, each memory cell comprising a ferroelectric capacitor for holding a charge and a transistor connected in parallel to the ferroelectric capacitor; a word-line shared by a ferroelectric memory cell in the first cell block and a ferroelectric memory cell in the second cell block, the ferroelectric memory cells together storing one set of information; a first plate line connected to the first cell block; a second plate line connected to the second cell block; and a selection transistor having one end connected to both the first and second cell blocks and another end connected to a bit-line, the method comprising the steps of: applying a voltage of Vcc/2 [V] to the bit-line and leaving the bit-line at a floating state; applying a voltage of 0 [V] to a word-line connected to ferroelectric memory cells from which information is to be read; and applying a voltage of Vcc [V] to the first plate line and applying a voltage of 0 [V] to the second plate line, thereby reading information from the ferroelectric memory cells.

A method for reading a ferroelectric semiconductor memory device according to another aspect of the present invention comprises: a first cell block and a second cell block, each cell block comprising a plurality of ferroelectric memory cells connected in series, each memory cell comprising a ferroelectric capacitor for holding a charge and a transistor connected in parallel to the ferroelectric capacitor; a word-line shared by a ferroelectric memory cell in the first cell block and a ferroelectric memory cell in the second cell block, the ferroelectric memory cells together storing one set of information; a first plate line connected to the first cell block; a second plate line connected to the second cell block; and a selection transistor having one end connected to both the first and second cell blocks and another end connected to a bit-line, the method comprising the steps of: applying a voltage of Vcc/2 [V] to the first plate line, the second plate line, and the bit-line and leaving the bit-line at a floating state; applying a voltage of 0 [V] to a word-line connected to ferroelectric memory cells from which information is to be read; and applying a voltage of Vcc [V] to the first plate line and applying a voltage of 0 [V] to the second plate line, thereby reading information from the ferroelectric memory cells.

BRIEF DESCRIPTION OF THE DRAWINGS

FIG. 7 is a time chart of reading a ferroelectric semiconductor memory device in a second embodiment of the present invention.

DETAILED DESCRIPTION OF THE EMBODIMENTS

A ferroelectric semiconductor memory device according to an embodiment of the present invention will now be described in detail.

Figure 1:
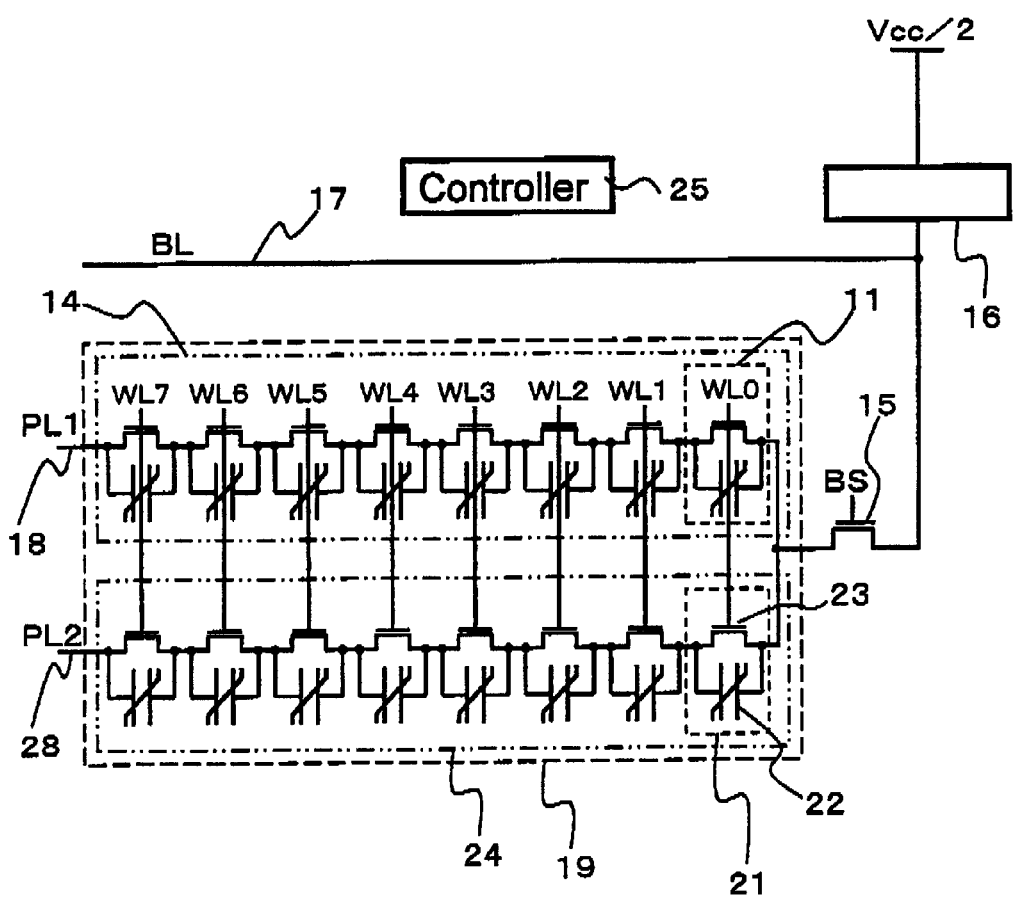
FIG. 1 shows a configuration diagram of a ferroelectric semiconductor memory device according to an embodiment of the present invention.

FIG. 1 shows a configuration of a ferroelectric semiconductor memory device such as a TC parallel unit series-connected FeRAM in this embodiment. Referring to FIG. 1, a ferroelectric memory cell 21 includes a ferroelectric capacitor 22 and a transistor 23 that are connected in parallel. In this embodiment, a memory cell array 19 includes a first cell block 14 and a second cell block 24. The first cell block 14 includes a plurality of ferroelectric memory cells 11 connected in series, each cell 11 having a similar configuration to the ferroelectric memory cell 21. The second cell block 24 includes a plurality of ferroelectric memory cells connected in series, each cell being like the ferroelectric memory cell 21.

The first cell block 14 has one end connected to a first plate line (PL1) 18. The second cell block 24 has one end connected to a second plate line (PL2) 28. The ferroelectric memory cell 21 in the second cell block 24 and the ferroelectric memory cell 11 in the complementary first cell block 14 share a word-line WL0. A set of information is stored in units of a pair of the ferroelectric memory cells 21 and 11.

The memory cell array 19 includes a plurality of word-lines WL1, WL2, WL3, WL4, WL5, WL6, and WL7 having a similar configuration to WL0. The array 19 also includes a plurality of pairs of ferroelectric memory cells, each pair sharing the word-lines, respectively. A set of information is stored in each pair in a manner similar to the above.

The stored information is read by applying a predetermined voltage to the word-lines WL0 to WL7, the first plate line (PL1) 18, and the second plate line (PL2) 28. A specific method for reading information will be described later.

The first and second cell blocks 14 and 24 have the other ends connected together to one end of a selection transistor (BS) 15. The selection transistor (BS) 15 has the other end connected to a bit-line (BL) 17 and a sense amplifier 16. The gate voltage of the selection transistor (BS) 15 may be controlled to connect the first and second cell blocks 14 and 24 with the sense amplifier 16. Information written in the ferroelectric memory cells selected by one of the word-lines WL0 to WL7 may be read through the sense amplifier 16. The sense amplifier 16 is applied with a voltage of Vcc/2 [V] as a reference voltage to read information written in the memory cells. A control circuit 25 controls voltages of: the plate lines PL1 and PL2; the word-lines WL0 to WL7; a gate of the selection transistor 15; and the like.

A method for reading information in the ferroelectric semiconductor memory device in this embodiment will now be described.

Figure 2:
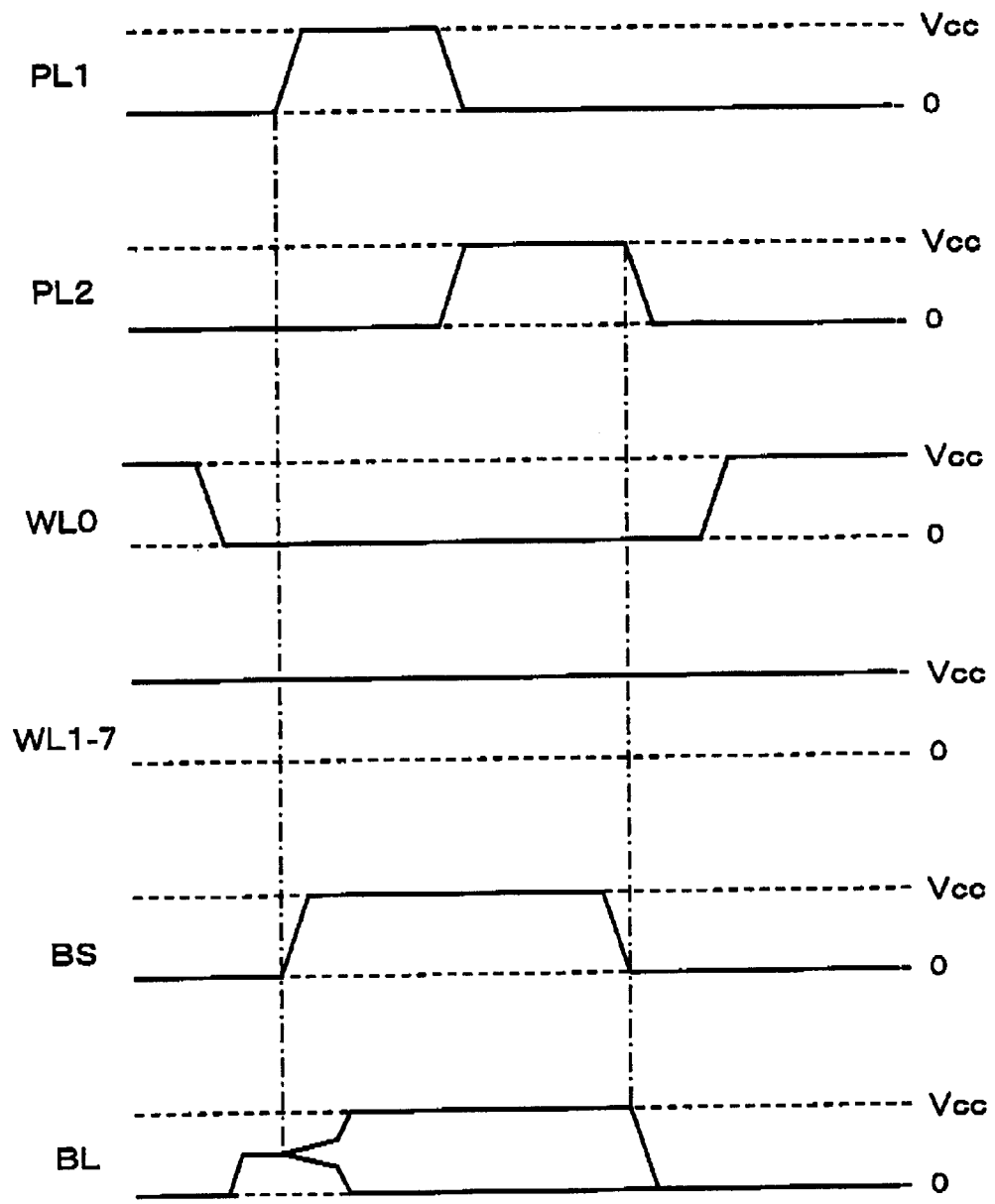
FIG. 2 shows a time chart of reading a ferroelectric semiconductor memory device in the first embodiment.

FIG. 2 shows a timing chart of reading data in the ferroelectric semiconductor memory device in FIG. 1. Referring to FIG. 2, the initial condition is as follows. The first plate line (PL1) 18 and the second plate line (PL2) 28 are applied with a voltage of 0 [V].

The word-lines WL0 to WL7 connected to the ferroelectric memory cells are applied with a voltage of Vcc [V].

The gate of the selection transistor (BS) 15 is applied with a voltage of 0 [V].

The bit-line (BL) 17 is applied with a voltage of 0 [V].

The bit-line (BL) 17 is then applied with a voltage of Vcc/2 [V] and then left at a floating state. The word-line WL0 connected to the ferroelectric memory cells 11 and 21 to be read is applied with a voltage of 0 [V]. The first plate line (PL1) 18 is then applied with a voltage of Vcc [V]. Information written in the ferroelectric memory cells 11 and 21 connected to the word-line WL0 is thus read. At the same time, the gate of the selection transistor (BS) 15 is applied with a voltage of Vcc [V]. The memory cells 11 and 21 are thus connected to the sense amplifier 16. The bit-line (BL) 17 therefore has a voltage corresponding to the charge on the ferroelectric capacitors in the read memory cells 11 and 21. The voltage is specifically described as follows. When the ferroelectric memory cells 11 and 21 connected to the common word-line WL0 store information of "1," the bit-line (BL) 17 has a voltage higher than Vcc/2 [V]. When the ferroelectric memory cells 11 and 21 connected to the common word-line WL0 store information of "0," the bit-line (BL) 17 has a voltage lower than Vcc/2 [V]. Corresponding to the voltage on the bit-line (BL) 17, information written in the ferroelectric memory cells may be read through the sense amplifier 16. Note that it does not matter whether the time when the bit-line (BL) 17 is left at a floating state is earlier or later than the time when the word-line WL0 connected to the ferroelectric memory cells 11 and 21 to be read is applied with a voltage of 0 [v], provided that these voltages are applied before the first plate line (PL1) 18 is applied with a voltage of Vcc [V]. In this embodiment, the ferroelectric memory cells 11 and 21 storing information of "1" means specifically as follows. The ferroelectric memory cell 11 is polarized in a direction from the selection transistor (BS) 15 to the first plate line (PL1) 18 in FIG. 1, and the ferroelectric memory cell 21 is polarized in a direction from the selection transistor (BS) 15 to the second plate line (PL2) 28 in FIG. 1.

The first plate line (PL1) 18 is then applied with a voltage of 0 [V] and the second plate line (PL2) 28 is applied with a voltage of Vcc [V], thereby allowing for rewriting of the read information. When information is read from the ferroelectric memory cells, the written information is destructed. Rewriting the read information to the ferroelectric memory cells may, however, hold the read information in the ferroelectric memory cells.

The gate of the selection transistor (BS) 15 is then applied with a voltage of 0 [V]. The second plate line (PL2) 28 and the bit-line (BL) 17 are then applied with a voltage of 0 [V]. The word-line WL0 is then applied with a voltage of Vcc [V].

This then completes the reading of information stored in the ferroelectric memory cells selected by the word-line WL0 and the writing of the read information.

In a similar way, information stored in the ferroelectric memory cells connected to the word-lines WL1 to WL7 may also be read and the read information may be written.

Information stored in the ferroelectric semiconductor memory device in this embodiment may thus be sequentially read.

Figure 3:
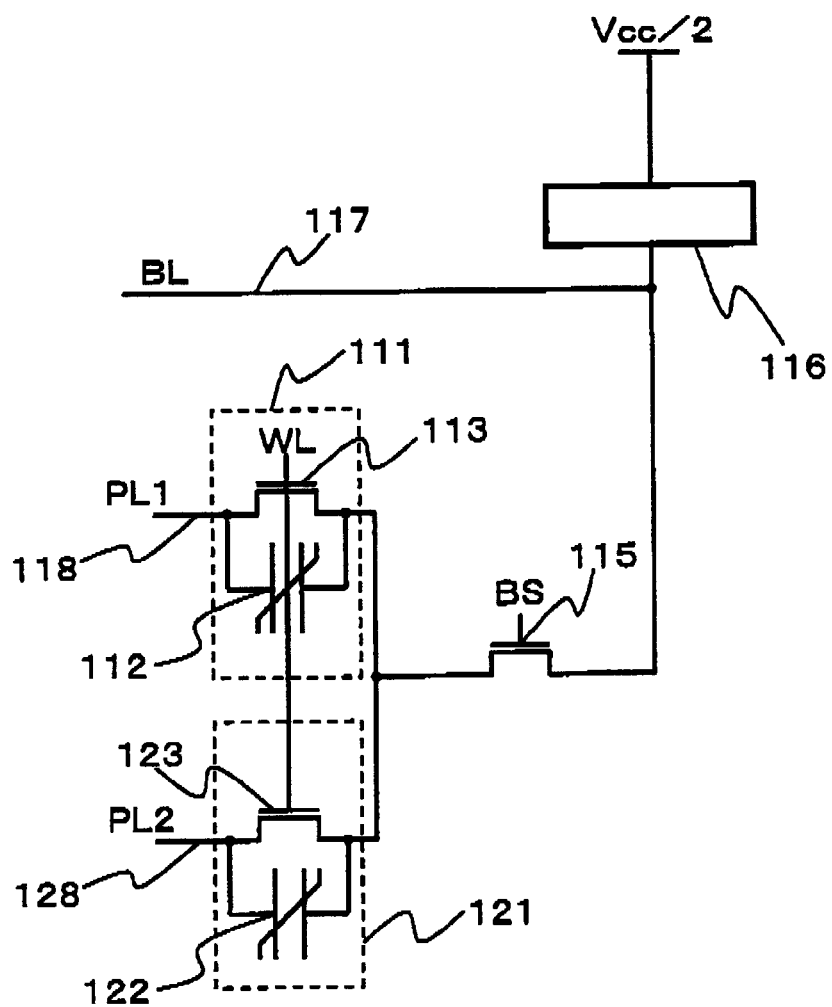
FIG. 3 shows a configuration diagram of a different ferroelectric semiconductor memory device in the first embodiment.

Thus, this embodiment illustrates one cell block including a plurality of ferroelectric memory cells. The one cell block may, however, include one ferroelectric memory cell as shown in FIG. 3. Specifically, the cell block may be configured as follows. A first ferroelectric memory cell 111 includes a ferroelectric capacitor 112 and a transistor 113 connected thereacross. The memory cell 111 has one end connected to a first plate line (PL1) 118. A second ferroelectric memory cell 121 includes a ferroelectric capacitor 122 and a transistor 123 connected thereacross. The memory cell 121 has one end connected to a second plate line (PL2) 128. The first and second ferroelectric memory cells 111 and 121 have the other ends connected together to the source of a selection transistor (BS) 115. A word-line WL, the plate line PL1, and the plate line PL2 may then be applied with predetermined voltages to read information. The information may then be read through a sense amplifier 116 by controlling a gate voltage of the selection transistor (BS) 115.

Figure 4:
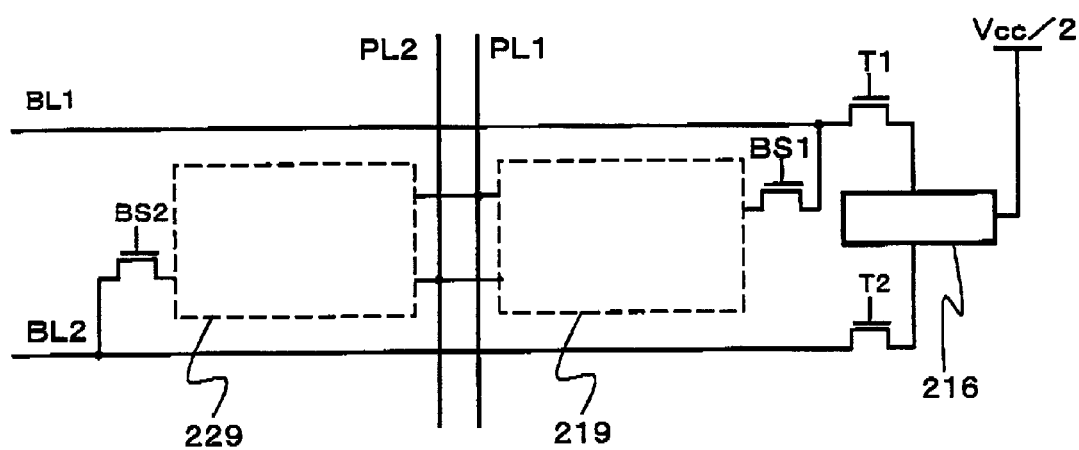
FIG. 4 shows a conceptive configuration diagram showing an arrangement of ferroelectric semiconductor memory devices according to an embodiment of the present invention.

FIG. 4 shows an example layout of a plurality of memory cell arrays, each cell array being like the memory cell array 19 in FIG. 1.

Referring to FIG. 4, a memory cell array 219 (which is equivalent to the memory cell array 19 in FIG. 1) has one end connected to the first plate line PL1 and the second plate line PL2, and the other end connected to the source of a selection transistor BS1. The selection transistor BS1 has a drain, which is connected to a bit-line BL1 and to a sense amplifier 216 via a transistor T1. A memory cell array 229 (which is equivalent to the memory cell array 19 in FIG. 1) has one end connected to the first plate line PL1 and the second plate line PL2 and the other end connected to the source of a selection transistor BS2. The selection transistor BS2 has a drain, which is connected to a bit-line BL2 and to a sense amplifier 216 via a transistor T2. The transistors T1 and T2 may be controlled to select the memory cell array 219 or 229 to be connected to the sense amplifier 216. It is thus possible to read information written in the ferroelectric memory cells in the selected memory cell array 219 or 229. The above configuration may thus provide a layout of a folded bit-line configuration.

[Principle of the Invention]

The principle of the ferroelectric semiconductor memory device according to the present invention will now be described.

Figure 5:
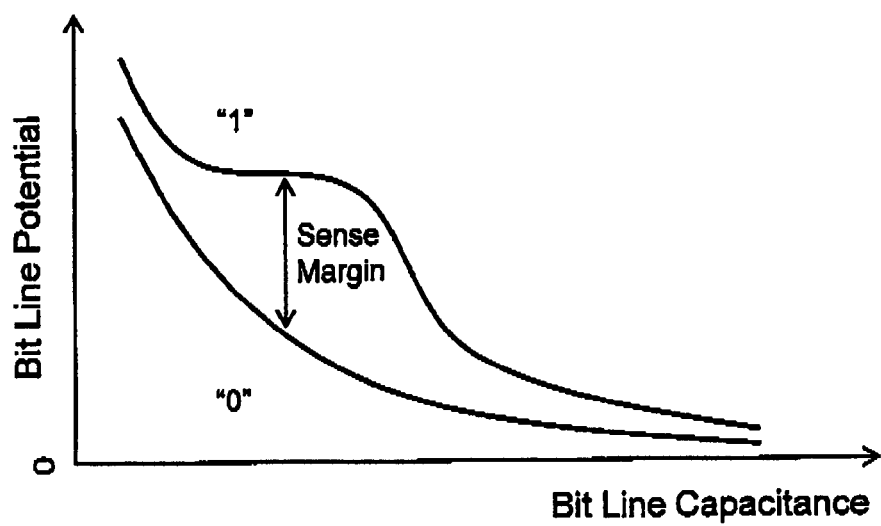
FIG. 5 shows a profile of bit-line potential versus bit-line capacitance in the 1T1C/2T2C scheme.

FIG. 5 shows a profile of bit-line potential versus bit-line capacitance in the TC parallel unit series-connected FeRAM in the 1T1C or 2T2C scheme. Referring to FIG. 5, the written information of "1" and "0" show different bit-line potentials. The written information of "1" and "0" both tend to show, however, a lower bit-line potential as the bit-line capacitance increases. The potential difference between the written information of "1" and "0" provides a sense margin. The sense margin decreases as the bit-line capacitance decreases or increases, thereby easily causing an error while reading information. To ensure a sufficient bit-line margin, the bit-line capacitance needs to be in a limited range. The circuit design needs to consider this point, thus increasing burden on the circuit design. In the bit-line capacitance range, the variation of the capacitance largely changes the bit-line potential. The different bit-lines may thus provide extremely close bit-line potentials for written "1" and "0," or even reversed bit-line potentials for "1" and "0." The written information may thus not be accurately read.

Figure 6:
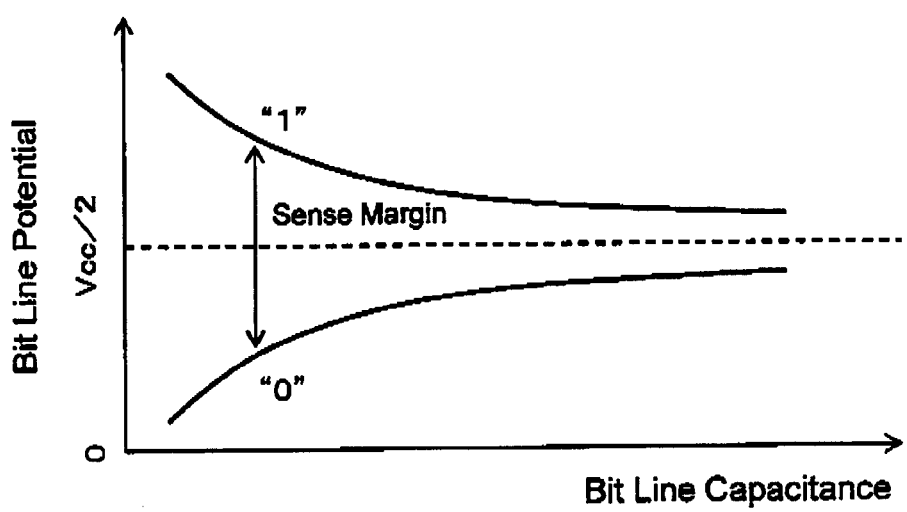
FIG. 6 shows a profile of bit-line potential versus bit-line capacitance in the 1T2C scheme.

FIG. 6 shows a profile of bit-line potential versus bit-line capacitance in the TC parallel unit series-connected FeRAM in the 1T2C scheme. Referring to FIG. 6, a lower bit-line capacitance provides a larger sense margin. This may facilitate the circuit design of the ferroelectric semiconductor memory device. Even if the different bit-lines have different bit-line capacitances, the written information of "1" and "0" never show reversed bit-line potentials. The written information may thus be accurately read. Specifically, the written information of "1" does not provide a bit-line potential of Vcc/2 [V] or lower for a larger bit-line capacitance. The written information of "0" does not provide a bit-line potential of Vcc/2 [V] or higher for a larger bit-line capacitance. Different read bit-lines thus never provide reversed bit-line potentials for the written information of "1" and "0." The written information may thus be accurately read.

The ferroelectric semiconductor memory device according to this embodiment is an FeRAM having a configuration based on the 1T2C scheme as shown in FIGS. 1 and 3. The memory device may thus provide stable data reading.

Second Embodiment

Another method for reading data according to a second embodiment of the present invention will be described below.

FIG. 7 shows a time chart of reproducing written information in the ferroelectric semiconductor memory device in the first embodiment in FIG. 1.

Referring to FIG. 7, the initial condition is as follows.

The first plate line (PL1) 18 and the second plate line (PL2) 28 are applied with a voltage of Vcc/2 [V].

The word-lines WL0 to WL7 connected to the ferroelectric memory cell are applied with a voltage of Vcc [V].

The gate of the selection transistor (BS) 15 is applied with a voltage of 0 [V]. The bit-line (BL) 17 is applied with a voltage of Vcc/2 [V] and then left at a floating state. The word-line WL0 connected to the ferroelectric memory cell to be read is applied with a voltage of 0 [V]. The first plate line (PL1) 18 is then applied with a voltage of Vcc [V], and the second plate line (PL2) 28 is applied with a voltage of 0 [V]. Information written in the ferroelectric memory cells connected to the word-line WL0 is thus read. At the same time, the gate of the selection transistor (BS) 15 is applied with a voltage of Vcc [V]. The memory cells 11 and 21 are thus connected with the sense amplifier 16. The bit-line (BL) 17 therefore has a voltage corresponding to the charge on the ferroelectric capacitors in the read memory cells. The voltage is specifically described as follows. When the ferroelectric memory cells store information of "1," the bit-line (BL) 17 has a voltage higher than Vcc/2 [V]. When the ferroelectric memory cells store information of "0," the bit-line (BL) 17 has a voltage lower than Vcc/2 [V]. Corresponding to the voltage on the bit-line (BL) 17, information written in the ferroelectric memory cells may be read through the sense amplifier 16. Note that it does not matter whether the time when the bit-line (BL) 17 is left at a floating state is earlier or later than the time when the word-line WL0 connected to the ferroelectric memory cells 11 and 21 to be read is applied with a voltage of 0 [v], provided that these voltages are applied before the first plate line (PL1) 18 is applied with a voltage of Vcc [V].

The first plate line (PL1) 18 is then applied with a voltage of 0 [V] and the second plate line (PL2) 28 is applied with a voltage of Vcc [V], thereby allowing for rewriting of the read information. When information is read from the ferroelectric memory cell, the written information is destructed, Rewriting the read information to the ferroelectric memory cells may, however, hold the read information in the ferroelectric memory cells.

The gate of the selection transistor (BS) 15 is then applied with a voltage of 0 [V]. The first plate line (PL1) 18 and the second plate line (PL2) 28 are then applied with a voltage of Vcc/2 [V]. The bit-line (BL) 17 is then applied with a voltage of Vcc/2 [V]. In addition, in order to apply a voltage of Vcc/2 [V] to the first plate line (PL1) 18 and the second plate line (PL2) 28, the first plate line (PL1) 18 and the second plate line (PL2) 28 may be connected to each other. This flows the charge in the second plate line (PL2) to the first plate line (PL1), thereby the potentials of the both plate lines being converged to Vcc/2. When applying a voltage of Vcc/2 to the bit line (BL) 17, the same phenomenon may occur by connecting plural bit lines to one another in the memory cell array. Note that the bit-line (BL) 17, the first plate line (PL1) 18, and the second plate line (PL2) may be temporarily left at a floating state, thereby allowing them to be charged by the charge held on other capacitance and the like. The power consumption may thus be reduced. This is referred to as the charge recycle.

The word-line WL0 is then applied with a voltage of Vcc [V]. This then completes the reading of the information stored in the ferroelectric memory cell connected to the word-line WL0 and the writing of the read information.

In a similar way, information written in the ferroelectric memory cells connected to the word-lines WL1 to WL7 may also be read.

Thus, information in the ferroelectric semiconductor memory device in this embodiment may be sequentially read.

In this embodiment, the charge recycle may reduce power consumption when reading information. Specifically, the bit-line (BL) 17, the first plate line (PL1) 18, and the second plate line (PL2) 28 may be applied with voltages not by receiving power directly from the power supply, but by being charged to a medium level of potential using the charge on other wirings and the like. The power consumption may thus be reduced.

Thus, the ferroelectric semiconductor memory devices according to the preferred embodiments of the present invention have been described in detail, but the present invention is not limited to the embodiments, and other embodiments may also be possible.

What is claimed is:

1. A ferroelectric semiconductor memory device comprising:
    a first ferroelectric memory cell and a second ferroelectric memory cell, the memory cells together storing one set of information, each memory cell comprising a ferroelectric capacitor for holding a charge and a transistor connected in parallel to the ferroelectric capacitor;
    a word-line shared by the first and second ferroelectric memory cells;
    a first plate line connected to the first ferroelectric memory cell;
    a second plate line connected to the second ferroelectric memory cell;
    a selection transistor having one end connected to both the first and second ferroelectric memory cells and another end connected to a bit-line; and
    a control circuit controlling voltages applied to a gate of the selection transistor, the first plate line, the second plate line, the word-line, and the bit-line.

2. The ferroelectric semiconductor memory device according to claim 1, wherein
    a plurality of the first ferroelectric memory cells connected in series form a first block,
    a plurality of the second ferroelectric memory cells connected in series form a second block, and
    the first and second ferroelectric memory cells sharing the word-line together store one set of information.

3. The ferroelectric semiconductor memory device according to claim 2, wherein
    the first and second blocks each comprise a plurality of ferroelectric memory cells connected in series, each memory cell comprising the ferroelectric capacitor and the transistor that are connected in parallel.

4. The ferroelectric semiconductor memory device according to claim 1, wherein
    the control circuit reads the information by performing steps comprising the steps of:
    applying a voltage of Vcc/2 [V] to the bit-line and leaving the bit-line at a floating state;
    applying a voltage of Vcc [V] to the first plate line and a voltage of 0 [V] to the second plate line; and
    applying a voltage of 0 [V] to the first plate line and a voltage of Vcc [V] to the second plate line.

5. The ferroelectric semiconductor memory device according to claim 3, further comprising a sense amplifier circuit connected to the bit-line, the sense amplifier circuit differentially amplifying a voltage of the bit-line and a reference voltage, wherein
    the reference voltage is set to a voltage of Vcc/2.

6. The ferroelectric semiconductor memory device according to claim 1, wherein
    the control circuit reads the information by performing steps comprising the steps of:
    applying a voltage of Vcc/2 [V] to the first plate line, the second plate line, and the bit-line, and leaving the bit-line at a floating state;
    applying a voltage of Vcc [V] to the first plate line and a voltage of 0 [V] to the second plate line; and
    applying a voltage of 0 [V] to the first plate line and a voltage of Vcc [V] to the second plate line.

7. The ferroelectric semiconductor memory device according to claim 6, further comprising a sense amplifier circuit connected to the bit-line, the sense amplifier circuit differentially amplifying a voltage of the bit-line and a reference voltage, wherein
    the reference voltage is set to a voltage of Vcc/2.

8. A method for reading a ferroelectric semiconductor memory device comprising:
    a first cell block and a second cell block, each cell block comprising a plurality of ferroelectric memory cells connected in series, each memory cell comprising a ferroelectric capacitor for holding a charge and a transistor connected in parallel to the ferroelectric capacitor;
    a word-line shared by a ferroelectric memory cell in the first cell block and a ferroelectric memory cell in the second cell block, the ferroelectric memory cells together storing one set of information;
    a first plate line connected to the first cell block;
    a second plate line connected to the second cell block; and
    a selection transistor having one end connected to both the first and second cell blocks and another end connected to a bit-line,
    the method comprising the steps of:
    applying a voltage of Vcc/2 [V] to the bit-line and leaving the bit-line at a floating state;
    applying a voltage of 0 [V] to a word-line connected to ferroelectric memory cells from which information is to be read; and
    applying a voltage of Vcc [V] to the first plate line and applying a voltage of 0 [V] to the second plate line, thereby reading information from the ferroelectric memory cells.

9. The method for reading a ferroelectric semiconductor memory device according to claim 8, further comprising the steps of:
    applying a voltage of Vcc [V] to the first plate line and applying a voltage of 0 [V] to the second plate line, thereby reading information from the ferroelectric memory cells; and
    applying a voltage of 0 [V] to the first plate line and applying a voltage of Vcc [V] to the second plate line, thereby rewriting the read information to the ferroelectric memory cells.

10. A method for reading a ferroelectric semiconductor memory device comprising:
    a first cell block and a second cell block, each cell block comprising a plurality of ferroelectric memory cells connected in series, each memory cell comprising a ferroelectric capacitor for holding a charge and a transistor connected in parallel to the ferroelectric capacitor;
    a word-line shared by a ferroelectric memory cell in the first cell block and a ferroelectric memory cell in the second cell block, the ferroelectric memory cells together storing one set of information;

a first plate line connected to the first cell block;

a second plate line connected to the second cell block; and a selection transistor having one end connected to both the first and second cell blocks and another end connected to a bit-line, the method comprising the steps of:

applying a voltage of Vcc/2 [V] to the first plate line, the second plate line, and the bit-line, and leaving the bit-line at a floating state;

applying a voltage of 0 [V] to a word-line connected to ferroelectric memory cells from which information is to be read; and applying a voltage of Vcc [V] to the first plate line and applying a voltage of 0 [V] to the second plate line, thereby reading information from the ferroelectric memory cells.

11. The method for reading a ferroelectric semiconductor memory device according to claim 10, further comprising the steps of:

applying a voltage of Vcc [V] to the first plate line and applying a voltage of 0 [V] to the second plate line, thereby reading information from the ferroelectric memory cells; and applying a voltage of 0 [V] to the first plate line and applying a voltage of Vcc [V] to the second plate line, thereby rewriting the read information to the ferroelectric memory cells.

* * * * *